(12) United States Patent
Liu et al.

(10) Patent No.: US 9,143,133 B2
(45) Date of Patent: Sep. 22, 2015

(54) OUTPUT APPARATUS, OUTPUT DRIVER, AND LEVEL SHIFTING SYSTEM

(71) Applicant: MStar Semiconductor, Inc., Hsinchu Hsien (TW)

(72) Inventors: Hsian-Feng Liu, Hsinchu County (TW); Chun-Chia Chen, Hsinchu County (TW); Hsin-Kuang Chen, Hsinchu County (TW); Yao-Zhong Zhang, Shanghai (CN)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/469,894

(22) Filed: Aug. 27, 2014

(65) Prior Publication Data

US 2015/0061746 A1  Mar. 5, 2015

(30) Foreign Application Priority Data

Aug. 27, 2013 (TW) .............................. 102130655 A

(51) Int. Cl.
*H03L 5/00* (2006.01)
*H03K 19/0185* (2006.01)

(52) U.S. Cl.
CPC .............................. *H03K 19/018521* (2013.01)

(58) Field of Classification Search
CPC . H03K 3/012; H03K 3/013; H03K 3/356104; H03K 19/0185; H03K 19/018507; H03K 19/018521

USPC ............................ 327/333; 326/63, 68, 80, 81
See application file for complete search history.

(56) References Cited

U.S. PATENT DOCUMENTS

| | | | | |
|---|---|---|---|---|
| 5,510,748 A | * | 4/1996 | Erhart et al. | 327/530 |
| 6,586,974 B1 | * | 7/2003 | Humphrey et al. | 327/108 |
| 7,088,151 B1 | * | 8/2006 | Dequina et al. | 327/108 |
| 2003/0080780 A1 | * | 5/2003 | Okamoto et al. | 326/83 |
| 2005/0040852 A1 | * | 2/2005 | Mentze et al. | 326/81 |
| 2006/0038593 A1 | * | 2/2006 | Abe | 327/112 |
| 2007/0176668 A1 | * | 8/2007 | Kimura | 327/333 |
| 2010/0164544 A1 | * | 7/2010 | Song | 326/80 |
| 2011/0316586 A1 | * | 12/2011 | Knierim | 326/80 |

* cited by examiner

*Primary Examiner* — William Hernandez
(74) *Attorney, Agent, or Firm* — WPAT, PC; Justin King

(57) ABSTRACT

An output driver for driving a pad includes a pull-up circuit and a pull-down circuit. The pull-up circuit includes first, second and third first-type transistors. The first and second first-type transistors are commonly controlled by a first logic signal. The third first-type transistor is connected in parallel to the second first-type transistor. The pull-down circuit includes first, second and third second-type transistors. The first and second second-type transistors are commonly controlled by a second logic signal. The third second-type transistor is connected in parallel to the second second-type transistor. The pull-up circuit is configured such that a response speed of the first first-type transistor to the first logic signal is lower than that of the second first-type transistor to the first logic signal.

7 Claims, 5 Drawing Sheets

OUTPUT APPARATUS, OUTPUT DRIVER, AND LEVEL SHIFTING SYSTEM

This application claims the benefit of Taiwan application Serial No. 102130655, filed Aug. 27, 2013, the subject matter of which is incorporated herein by reference.

BACKGROUND OF THE INVENTION

1. Field of the Invention

The invention relates to an output apparatus, an output driver and a level shifting system.

2. Description of the Related Art

An integrated circuit is generally divided into a core portion and an input/output (I/O) portion. The I/O portion bridges the communication to the external for the core portion. In addition to transmitting core signals generated by the core portion to outside the integrated circuit via a pad, the I/O portion also needs to transmit external signals sent from the external to the pad further to the core portion for processing.

It is required that the operating voltage of the core portion be reduced with demands of the increasing operating speed and power saving effect of electronic products. Similarly, to increase the transmission efficiency of external signals between integrated circuits, the driving voltage of new-generation external signals is also lowered. Take a double-data-rate three synchronous dynamic random access memory (DDR3 SDRAM) for example. The specified operating voltage of the DDR3 SDRAM is 1.5V, whereas the operating voltages of the DDR1 and DDR2 SDRAMs are 2.5V and 1.8V, respectively. In the latest DDR4, the operating voltage is reduced to even as low as 1.2V.

Two devices can be manufactured from a semiconductor wafer by a conventional semiconductor manufacturing process—a core device and an I/O device. For example, it is essential that the reliability of the core device be ensured under all kinds of operating voltage combinations when all conducting nodes (e.g., the gate, drain and source) operate under a 1.1V voltage. Further, it is essential that the reliability of the I/O device be ensured under all kinds of operating voltage combinations when all conducting nodes (e.g., the gate, drain and source) operate under a 1.5V voltage. For example, when the I/O device and the core device are both MOS devices, the gate oxidation layer in the I/O device is thicker than the gate oxidation layer in the core device. In comparison, the core device has a faster speed and a larger driving capability, while the I/O device has better robustness for withstanding a higher voltage stress.

FIG. 1 shows a conventional output apparatus 100, which is applicable to DDR3 and is an I/O portion in an integrated circuit. The output apparatus 100 drives a pad 102, and is powered by power lines Vddio and Vssio having 1.5V and 0V voltages, respectively. The output apparatus 100 includes a level shifting circuit 106, a high buffer circuit 108H, a low buffer circuit 108L, and an output driver 110. For speed and power-saving considerations, a core circuit 104 adopts a core device, and is powered by core power lines Vddcore and Vsscore having 1.1V and 0V voltages, respectively. The output apparatus 100 adopts an I/O device. In the output driver 100, implemented by I/O devices with smaller driving capabilities and being required to satisfy DDR3 driving capability specifications, a pull-up PMOS PH and a pull-down NMOS NL occupy a considerable amount of a silicon area.

In the prior art, it is proposed that a core device be utilized in the conventional output driver to reduce the silicon area required. FIG. 2 shows another conventional output driver 120 for replacing the output driver 110 in FIG. 1. In the output driver 120, PMOS PH1 and PH2 as well as NMOS NL1 and NL2 are implemented by core devices. Control gates of the PMOS PH2 and the NMOS NL2 are respectively connected to power lines Vbp and Vbn having 0.4V and 1.1V voltages, respectively. A control gate of the PMOS PH1 receives a logic signal Sp, whose high and low logic levels are 1.5V and 0.4V, respectively. A control gate of the NMOS NL1 receives a logic signal Sn, whose high and low logic levels are 1.1V and 0V, respectively. The high logic level refers to a voltage level of a signal when the signal is logic "1", and the low logic level refers to the voltage of the signal when the signal is logic "0". The PMOS PH1 and PH2 are connected in series, and the NMOS NL1 and NL2 are connected in series. Such series structure prevents the core devices (the PMOS PH1 and PH2 as well as the NMOS NL1 and NL2) originally operating at a 1.1V operating voltage from potential damages caused by the stress of an excessive operating voltage (1.5V).

In the output driver 120, parasitic capacitance between the control gate of the PMOS PH2 and the pad 102 is quite large. To prevent capacitance coupling from causing an unstable voltage of the power line Vpb when a signal change occurs at the pad 102, the control gate of the PMOS PH2 needs to be connected to a large decoupling capacitor 122. Similarly, the control gate of the NMOS NL2 also needs to be connected to a large decoupling capacitor 124 to mitigate influences that the signal change at the pad 102 poses on the voltage of the power line Vbn. The decoupling capacitors 122 and 124 also occupy a considerable amount of the silicon area.

SUMMARY OF THE INVENTION

According to an embodiment of the present invention, an output driver for driving a pad is disclosed. The output driver includes a pull-up circuit and a pull-down circuit. The pull-up circuit includes first, second and third first-type transistors. The first and second first-type transistors are connected in series between a high power line and the pad, and are commonly controlled by a first logic signal. The third first-type transistor is connected in parallel to the second first-type transistor, and is provided with a bias by a first power line. The pull-down circuit includes first, second and third second-type transistors. The first and second second-type transistors are connected in series between a low power line and the pad, and are commonly controlled by a second logic signal. The third second-type transistor is connected in parallel to the second second-type transistor, and is provided with a bias by a second power line. The pull-up circuit is configured such that a response speed of the first first-type transistor to the first logic signal is lower than that of the second first-type transistor to the first logic signal.

According to another embodiment of the present invention, a level shifting system powered by a high power line and a low power line is disclosed. The level shifting system includes a bias providing circuit and a first level shifting circuit. The bias providing circuit includes a reference level shifting circuit and a feedback circuit. The reference level shifting circuit is controlled by a first input logic level and a reference bias to output a first output logic level. The feedback circuit adjusts the reference bias such that the first output logic level is substantially stabilized at a predetermined value. The first level shifting circuit has a same circuit configuration as the reference level shifting circuit, and is controlled by an input signal and the reference bias to output an output signal. When the input signal is at the first input logic level, a voltage of the output signal is approximately equal to the predetermined value. When the input signal is at another logic level, the voltage of the output signal is approximately equal to a voltage of either the high power line or the low power line.

According to another embodiment of the present invention, an output apparatus is disclosed. The output apparatus includes a high level shifting circuit, a high buffer circuit, a low level shifting circuit, a low buffer circuit, and an output circuit. The high level shifting circuit shifts an input signal to a high output signal. The input signal has to two input logic levels, and the high output signal has two high output logic levels. The high buffer circuit drives a high control node according to the high output signal. The low level shifting circuit shifts the input signal to a low output signal. The low output signal has two low output logic levels. The low buffer circuit drives a low control node according to the low output signal. The output driver includes the high control node and the low control node, and drives a pad. The two low output logic levels and the two input logic levels are the same.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 3:
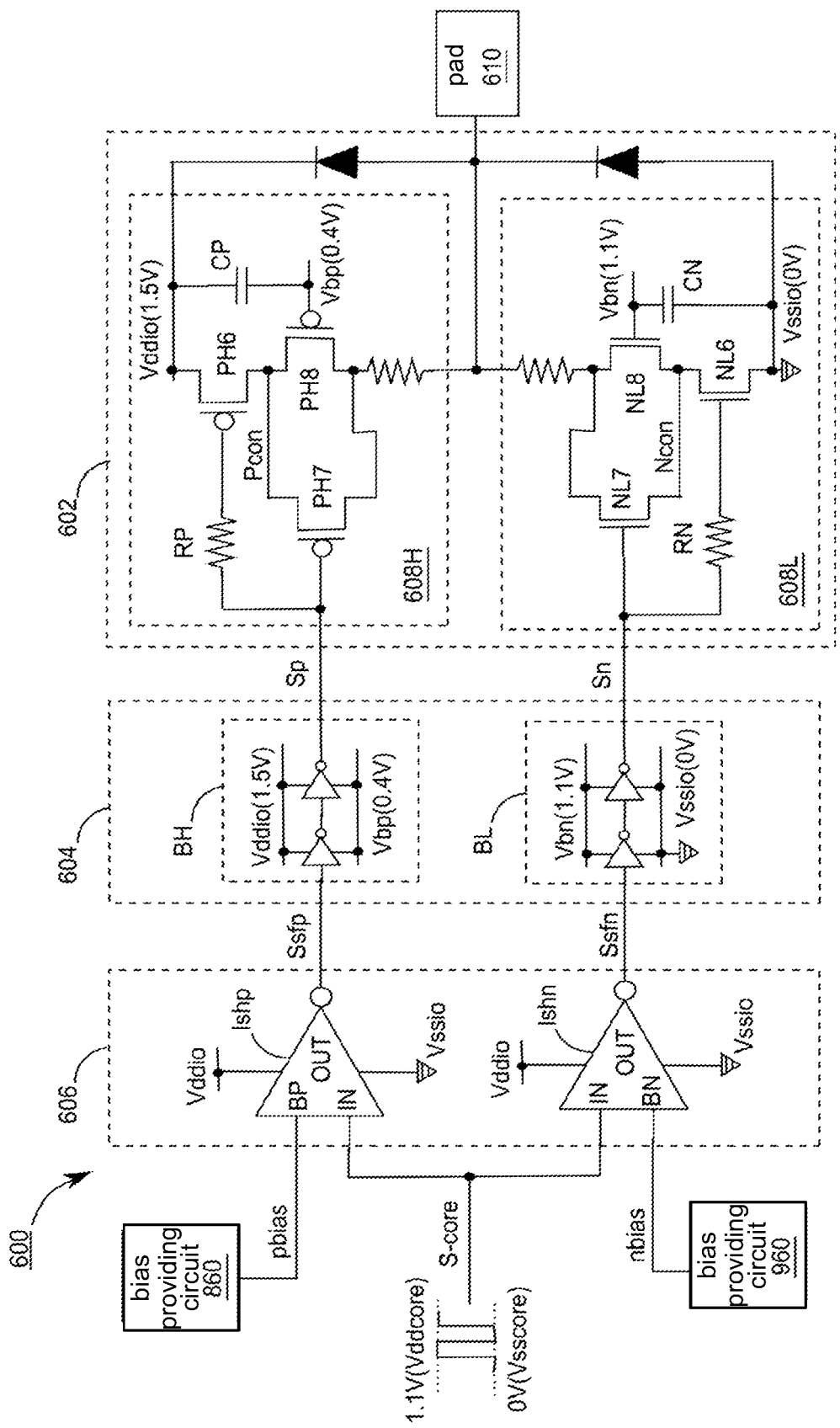
FIG. 3 is an output apparatus according to an embodiment of the present invention.

FIG. 3 shows an output apparatus 600 according to an embodiment of the present invention. The output apparatus 600 includes a level shifting portion 606, a buffer portion 604, and an output driver 602. The output apparatus 600 adopts core devices to reduce a silicon area required. It should be noted that, the output apparatus 600 is a non-limiting embodiment of the present invention. For example, according to another embodiment of the present invention, an output apparatus may simultaneously include a core device and an I/O device.

In the embodiment below, for example, core power lines Vddcore and Vsscore are respectively 1.1V and 0V, and I/O power lines Vddio and Vssio are respectively 1.5V and 0V, and are applicable to a DDR3 I/O driver. However, in other embodiments of the present invention, I/O apparatuses of other DDR specifications may be applied, with the I/O power line Vddio being 1.35V or 1.2V.

In FIG. 3, the level shifting portion 606 includes a high level shifting circuit Ishp and a low level shifting circuit Ishn. The high level shifting circuit Ishp is controlled by a core signal S-core and a reference bias pbias to generate an output signal Ssfp. High and low logic levels of the core signal S-core are a voltage of the core power line Vsscore and a voltage of the core power line Vddcore, respectively; for example, 0V and 1.1V, respectively. High and low logic levels of the output signal Ssfp are about voltages of the I/O power line Vddio and a power line Vbp, respectively; for example, 1.5V and 0.4V, respectively. The low level shifting circuit Ishn is controlled by the core signal S-core and a reference bias nbias to generate an output signal Ssfn. High and low levels of the output signal Ssfn are about voltages of a power line Vbn and the I/O power line Vssio, respectively; for example, 1.1V and 0V. Bias providing circuits 860 and 960 provide the biases pbias and nbias, respectively. It is observed that the high and low logic levels of the output signal Ssfn are the same as those of the core signal S-core. Despite that the high level shifting circuit Ishp and the low level shifting circuit Ishn are both powered by the I/O power lines Vddio and Vssio, only the high level shifting circuit Ishp but not the low level shifting circuit Ishn provides a level shifting function. Details of internal circuits and operations of the high level shifting circuit Ishp and the low level shifting circuit Ishn are to be described shortly.

The buffer portion 604 includes a high buffer circuit BH and a low buffer circuit BL. As shown in FIG. 3, the high buffer circuit BH, powered by the I/O power lines Vddio and Vbp and including two inverters, is for reducing a capacitive load of the high level shifting circuit Ishp and generates a logic signal Sp according to the output signal Ssfp. Similarly, the low buffer circuit BL, powered by the power lines Vbn and Vssio, is for reducing a capacitive load of the low level shifting circuit Ishn and generates a logic signal Sn according to the output signal Ssfn.

The output driver 602 includes a pull-up circuit 608H and a pull-down circuit 608L.

The pull-up circuit 608H includes a resistor RP, and PMOS PH6, PH7 and PH8. The PMOS PH7 and the PMOS PH8 are connected in parallel between the PMOS PH6 and the pad 610. The PMOS PH6 is connected between the I/O power line Vddio and the PMOS PH7. A decoupling capacitor CP is connected between a control node of the PMOS PH8 and the I/O power line Vddio, and the control node of the PMOS PH8 is connected to the power line Vbp. The decoupling capacitor CP is capable of reducing influences that a signal change at the pad 610 poses on the power line Vbp.

Although the PMOS PH6 and PH7 are controlled by the signal Sp, due to the existence of the resistor RP, a response speed of the PMOS PH6 to the signal Sp is lower than a response speed of the PMOS PH7 to the signal Sp.

As shown in the diagram, the circuit configuration of the pull-down circuit 608L is similar to that of the pull-up circuit 608H, and can be understood from the description on the pull-up circuit 608H without further discussion.

When logic values of the logic signals Sp and Sn are fixed at "0", voltages of the logic signals Sp and Sn are 0.4V and 0V, respectively. At this point, the pad 610 is charged to about 1.5V. Due to a clamping effect of the NMOS NL8, a voltage at a connection node Ncon between the NMOS NL8 and NL6 is pre-charged to 1.1V-Vthn, where Vthn is a threshold voltage of certain NMOS transistors in the integrated circuit. In an example, Vthn is 0.81V, and the threshold voltage of certain PMOS transistors in the integrated circuit is Vthp=−1.05V. When the logic values of the signals Sp and Sn change from "0" to "1", the voltages of the signals Sp and Sn change to 1.5V and 1.1V, respectively. At this point, the PMOS PH6 is turned off as open circuit, and the pad 610 is pulled down by the conducted NMOS NL6, NL7 and NL8 such that the voltage value at the pad 610 falls from 1.5V towards 0V. The response speed of the NMOS NL6 to the logic signal Sn is lower than the response speed of the NMOS NL7 to the logic signal Sn, and so the voltage at the connection node Ncon moderately falls. Thus, a maximum drain-to-source voltage of the NMOS NL8 is prevented from excessively exceeding 1.1V and from generating hot electrons that damage the NMOS NL8.

Similarly, when the logic values of the signals Sp and Sn change from "1" to "0", the NMOS NL6 is turned off as open circuit, and the pad 610 is pulled up by the conducted PMOS PH6, PH7 and PH8 such that the voltage at the pad 610 rises from 0V towards 1.5V. The response speed of the PMOS PH6 to the signal Sp is lower than the response speed of the PMOS PH7 to the signal Sp, and so a voltage at a connection node Pcon moderately rises. Thus, a minimum drain-to-source voltage of the PMOS PH8 can be controlled around −1.1V to prevent from generating hot electrons having a strong energy that damage the PMOS PH8.

Although the pull-down circuit 608L and the pull-up circuit 608H both adopt core devices applicable to a 1.1V operating voltage, they are powered by a higher 1.5V power. It is known from the above analysis and reliability simulation verifications that, with appropriate designs, the pull-up circuit 608H and the pull-down circuit 608L can meet general commercial reliability requirements.

Figure 1:
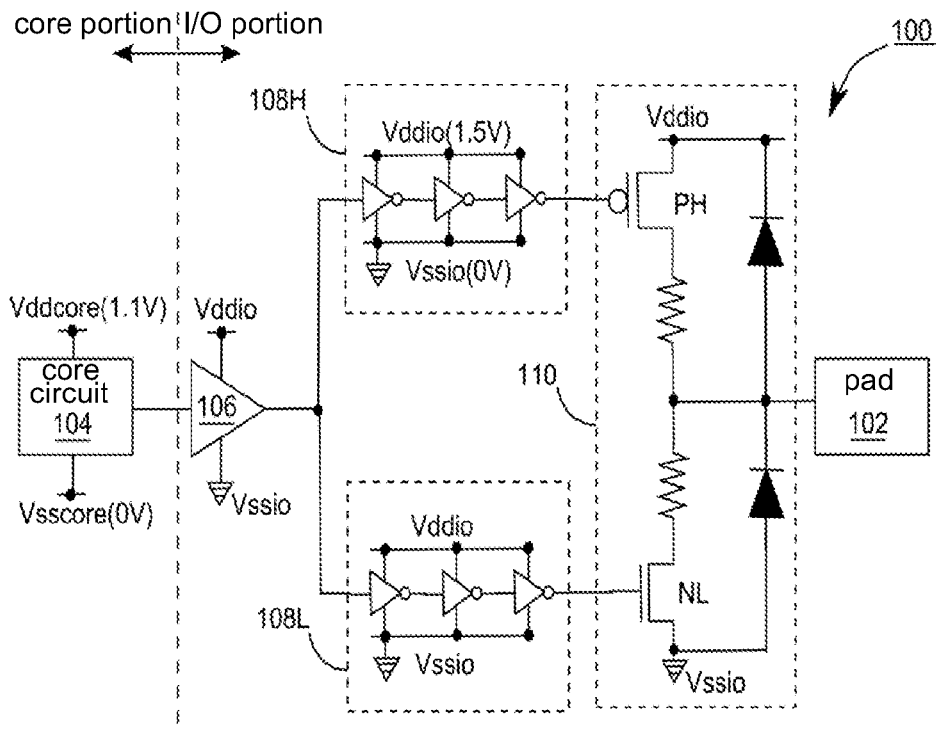
FIG. 1 is a conventional output apparatus.
Figure 2:
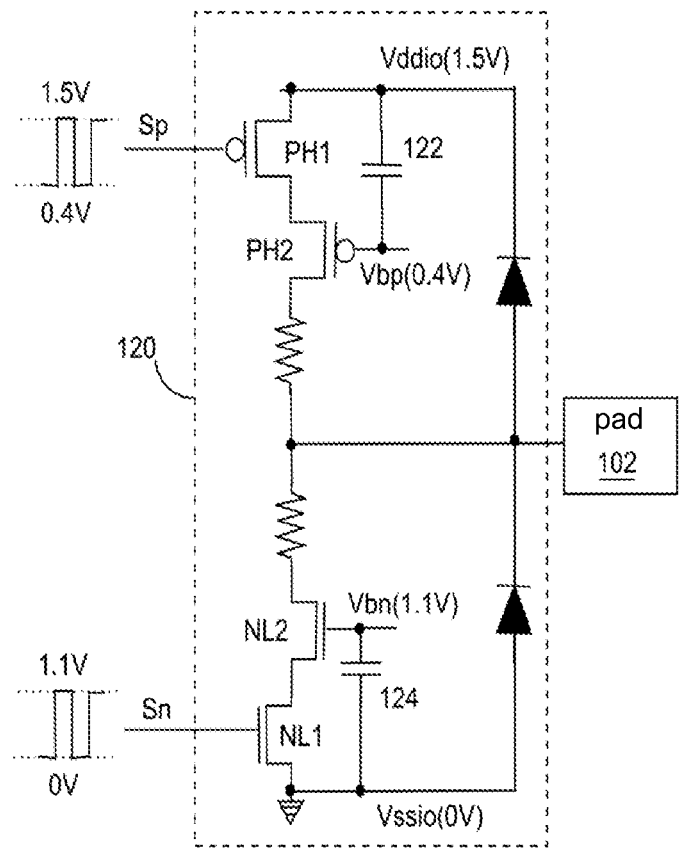
FIG. 2 is another conventional output apparatus.

From perspectives of achieving the same driving capability, a total current driving capability of the NMOS NL7 and NL8 in FIG. 3 needs to be approximately equal to the current driving capability of the NMOS NL2 in FIG. 2 of prior art. Therefore, comparing the sizes of the devices, the NMOS NL8 can be smaller than the NMOS NL2, and so the parasitic capacitance between the control gate of the NMOS NL8 and the pad 610 is also smaller. Further, compared to the decoupling capacitor 124 in FIG. 2 of prior art, the decoupling capacitor CN in FIG. 3 can be smaller to save some silicon area. Similarly, the decoupling capacitor CP in FIG. 3 may also be smaller than the decoupling capacitor 122 in FIG. 2 of prior art to save some silicon area.

Figure 4A:
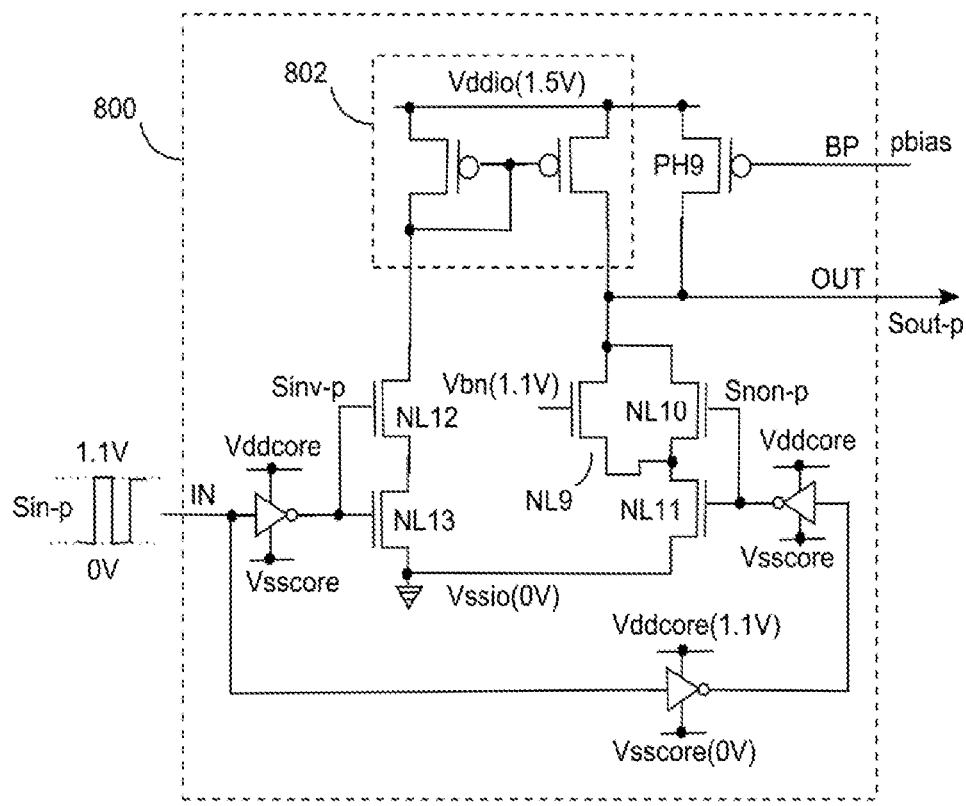
FIG. 4A is a high level shifting circuit.

FIG. 4A shows a high level shifting circuit 800 that can be utilized as the high level shifting circuit Ishp in FIG. 3. The high level shifting circuit 800 is implemented by core devices. The high level shifting circuit 800 receives an input signal Sin-p and a reference bias pbias from input ends IN and BP, respectively, and generates an output signal Sout-p at an output end.

Three inverters in FIG. 4A are power by a core power line Vddcore and core power line Vsscore (having 1.1V and 0V voltages, respectively), and generate an inverted signals Sinv-p and a non-inverted signal Snon-p according to the input signal Sin-p. Connection details of other NMOS and PMOS are as shown in FIG. 4A. The NMOS and PMOS are powered by an I/O power line Vddio and an I/O power line Vssio having 1.5V and 0V voltages, respectively. Connections of NMOS NL9, NL10 and NL11 are similar to those of the pull-down circuit 608L in FIG. 3. Operation principles and effects on the device reliability of the NMOS NL9, NL10 and NL11 can also be deduced, and shall be omitted herein.

When a logic value of the input signal Sin-p is "0", a voltage of the input signal Sin-p is 0V, and voltages of the inverted signal Sinv-p and the non-inverted signal Snon-p are 1.1V and 0V, respectively. At this point, the NMOS NL11 is turned off as open circuit, and so the output signal Sout-p is charged by a charging current generated by a current mirror 802 until the voltage of the output signal Sout-p is equal to the voltage (1.5V) of the I/O power line Vddio. A logic value of the output signal Sout-p changes to "1".

When the logic value of the input signal Sin-p is "1", the voltage of the input signal Sin-p is 1.1V, and the voltages of the inverted signal Sinv-p and the non-inverted signal Snon-p are 0V and 1.1V, respectively. At this point, as the NMOS NL12 and NL13 are both open circuit, the charge current that the current mirror 802 generates to the output signal Sout-p is diminished (to become 0). Being in a short-circuit conducted status, a combination of the NMOS NL9, NL10 and NL11 may be equivalently regarded as a pull-down resistor. A gate of the PMOS PH9 is connected to the reference bias pbias, and the PMOS PH9 may be equivalently regarded as a pull-up resistor. The pull-down resistor and the pull-up resistor form a voltage dividing circuit, such that the voltage of the output signal Sout-p at this point can be stabilized at a predetermined value. Given an appropriate reference bias pbias, this predetermined value can be controlled at 0.4V, which is approximately equal to the voltage of the power line Vbp. Associated details are to be described shortly. The logic value of the output signal Sout-p changes to "0".

Figure 4B:
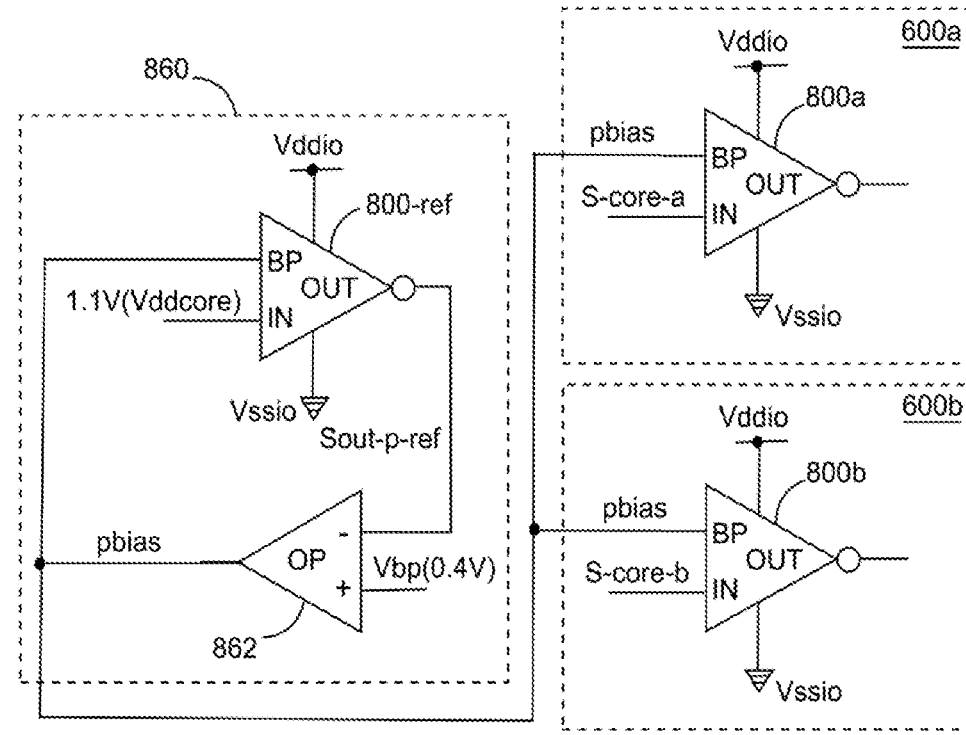
FIG. 4B is a level shifting system.

FIG. 4B shows a level shifting system that explains how a reference bias pbias is generated and applied in an embodiment. In FIG. 4B, a bias providing circuit 860 and output apparatuses 600*a* and 600*b* are depicted. Each of the output apparatuses 600*a* and 600*b* may be implemented by the output apparatus 600 in FIG. 3. The output apparatuses 600*a* and 600*b* include high level shifting circuits 800*a* and 800*b*, respectively. The bias providing circuit 860 also includes a high level shifting circuit 800-ref. Each of the high level shifting circuits in FIG. 4B may be implemented by the high level shifting circuit 800 in FIG. 4A. In the present invention, instead of providing a reference bias to two output apparatuses, one bias providing circuit may also provide the reference bias to one or more output apparatuses.

The bias providing circuit 860 further includes an operational amplifier 862 that generates the reference bias pbias. The reference bias pbias is provided to an input end BP of each of the high level shifting circuits in FIG. 4B. Two input ends of the operational amplifier 862 are respectively connected to an output end OUT of the high level shifting circuit 800-ref and a power line Vbp. An input end IN of the high level shifting circuit 800-ref is connected to 1.1V, i.e., a high logic level of a core signal S-core. The operational amplifier 862 provides a negative feedback mechanism and controls the reference bias pbias, such that an output signal Sout-p-ref outputted by the high level shifting circuit 800-ref is approximately stabilized at a voltage (0.4V) of the power line Vbp.

As previously discussed in FIG. 4A, when the logic level of the input signal Sin-p is "0", the voltage of the input signal is 0V. At this point, the logic level of the output signal Sout-p changes to "1" and the voltage of the output signal Sout-p is 1.5V. When the logic value of the input signal Sin-p is "1", the voltage of the input signal Sin-p is voltage 1.1V. Meanwhile, the logic value of the output signal Sout-p changes to "0", and the voltage value of the output signal Sout-p is controlled by the reference bias pbias. As the reference bias pbias in FIG. 4B renders the output signal Sout-p-ref of the high level shifting circuit 800-ref to be approximately stabilized at 0.4V, the low output logic levels corresponding to the logic values "0" of output signals of the high level shifting circuits 800*a* and 800*b* are both about 0.4V.

The level shifting system in FIG. 4B at least provide an advantage—the low output logic level (0.4V in this embodiment) of each high level shifting circuit substantially remains unaffected from semiconductor manufacturing drifts. One reason is because the negative feedback mechanism provided in the bias providing circuit 860 automatically adjusts the reference bias pbias regardless of how a semiconductor manufacturing process drifts. By stabilizing the output signal Sout-p-ref at 0.4V, the low output logic level of the output signal of each high level shifting circuit is also stabilized.

Figure 5A:
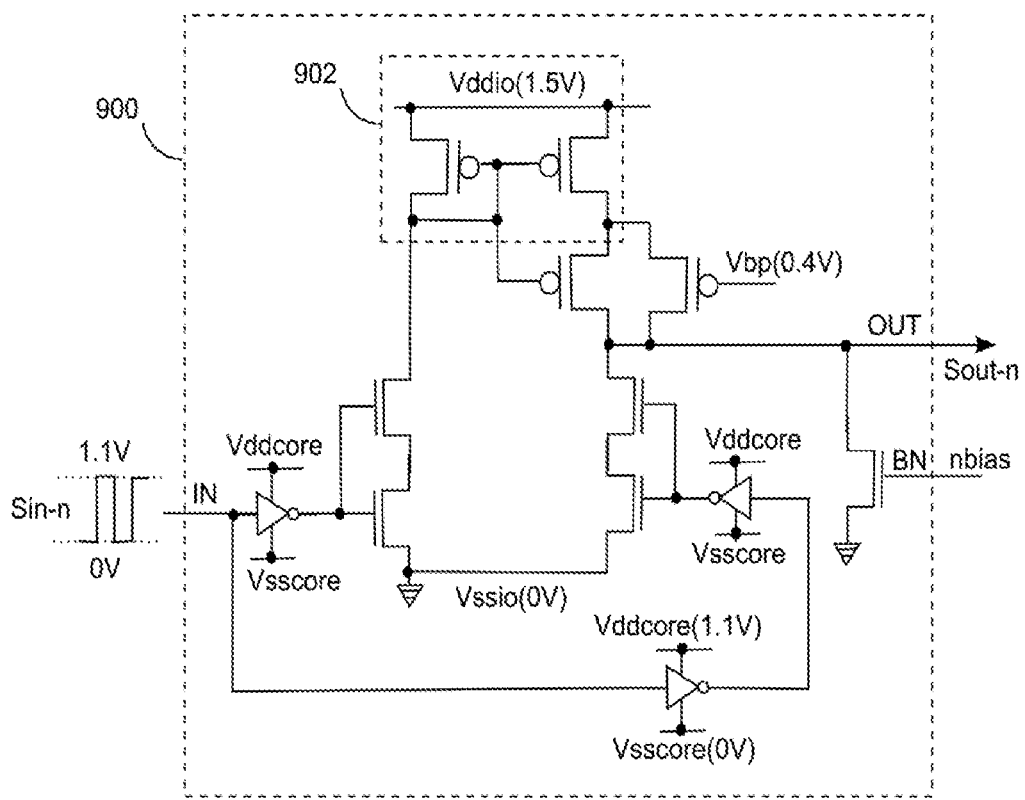
FIG. 5A is a low level shifting circuit.
Figure 5B:
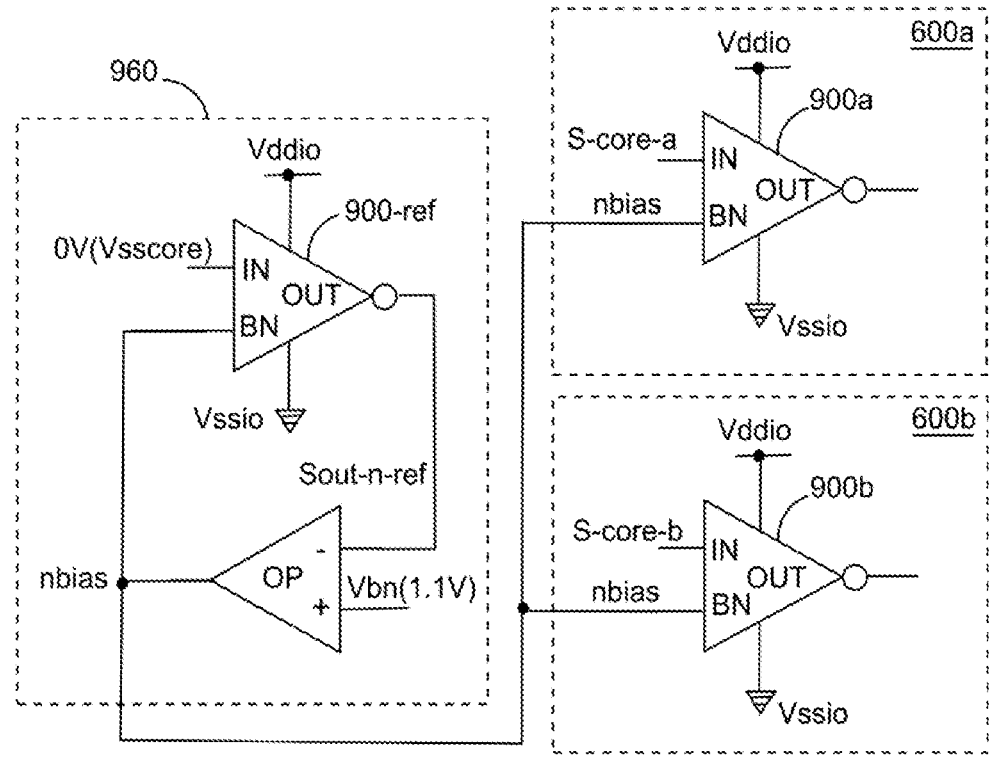
FIG. 5B is another level shifting system.

FIG. 5A shows a low level shifting circuit 900, which can be utilized as the low level shifting circuit Ishn in FIG. 3. FIG. 5B shows another level shifting system. Operations and descriptions of FIG. 5A and FIG. 5B can be deduced from those of FIG. 4A and FIG. 4B. In simple, in the low level shifting circuit 900 in FIG. 5A, a low output logic level of an output signal Sout-n is 0V, and a high output logic level of the output signal Sout-n is determined by a reference bias nbias. A bias providing circuit 960 in FIG. 5B provides a negative feedback mechanism, which automatically adjusts the reference bias nbias regardless of how a semiconductor manufacturing process drifts to stabilize an output signal Sout-n-ref at 1.1V. Meanwhile, a high output logic level of an output signal of each low level shifting circuit is also stabilized at 1.1V.

In FIG. 3, as the high and low logic levels of the output signal Ssfn are the same as the high and low logic levels of the core signal S-core, the low level shifting circuit Ishn substantially does not perform level shifting. However, with the coexistence of the low level shifting circuit Ishn and the high level shifting circuit Ishp, a non-overlapping function is automatically provided, i.e., the pull-down circuit 608L and the pull-up circuit 608H in FIG. 3 do not simultaneously become turned on. If the pull-down circuit 608L and the pull-up circuit 608H are simultaneously turned on, a current path will be formed between the I/O power lines Vddio and Vssio to generate a shoot through current. In that case, not only power is wasted, but also the voltages of the I/O power lines Vddio or Vssio may be caused to be unstable to trigger logic misjudgment of certain logic circuits.

As previously discussed in FIG. 4A, when the logic value of the output signal Sout-p changes from "0" to "1", under a condition of no pull-down current, the voltage of the output signal Sout-p starts rising from 0.4V to 1.5V by the sole effect of the current mirror 802. Therefore, given that the charging current provided by the current mirror 802 is large enough, a change rate of the rising voltage of the output signal Sout-p can be quite large. Conversely, when the logic value of the output signal Sout-p changes from "1" to "0", the voltage of the output signal Sout-p changes from 1.5V to 0.4V by a counterbalancing process between a pull-up resistor and a pull-down resistor. Thus, it can be expected that a change rate of the falling voltage of the output signal Sout-p is slower compared to the change rate of the rising voltage.

Similar to the principles in FIG. 4A, a change rate of the rising voltage of the output signal Sout-n in FIG. 5A is expectedly slower than a change rate of the falling voltage of the output signal Sout-n.

In practice, the change rate of the rising voltage of the output signal Sout-n can be easily designed to be lower than the change rate of the rising voltage of the output signal Sout-p, and the change rate of the falling voltage of the output signal Sout-p can be easily designed to be lower than the change rate of the falling voltage of the output signal Sout-n. As such, the non-overlapping function can be generated while also simplifying designs of the high and low buffer circuits BH and BL in FIG. 3.

Figure 6:
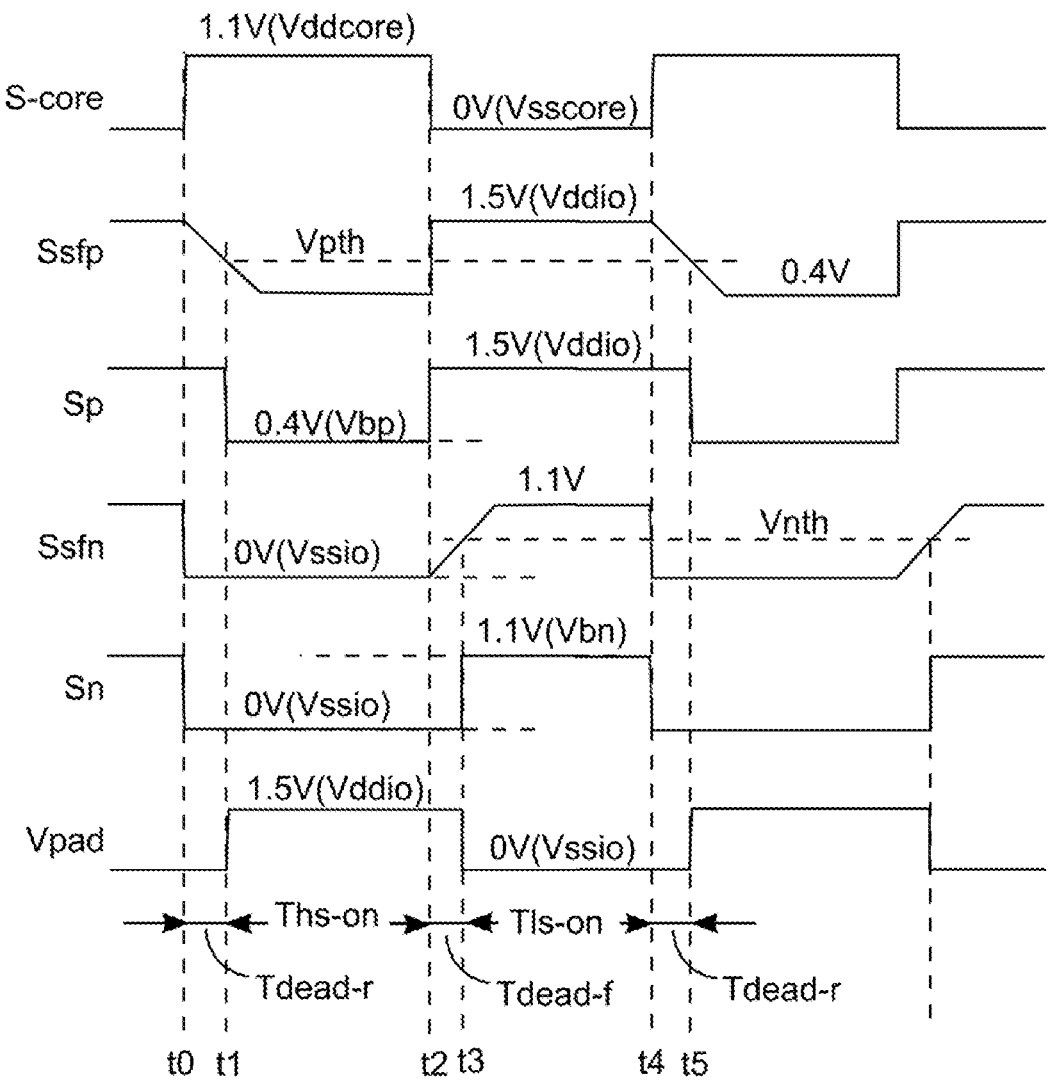
FIG. 6 shows examples of signal waveforms in FIG. 3.

FIG. 6 shows some examples of signal waveforms in FIG. 3. From top to bottom, waveforms of the core signal S-core, the output signal Ssfp, the logic signal Sp, the output signal Ssfn, the logic signal Sn and a voltage Vpad on the pad 610 are depicted. Associated details are given below with reference to the output apparatus 600 in FIG. 3.

Before a time point t0, the core signal S-core is 0V, the output signal Ssfp, the signal Sp, the output signal Ssfn and the signal Sn are all logic "1", the pull-up circuit 608H is turned off and the pull-down circuit 608L is turned on. Thus, the voltage Vpad is 0V.

At the time point t0, the core signal S-core changes from 0V to 1.1V. Thus, the output signal Ssfp of the high level shifting circuit Ishp starts falling moderately from 1.5V towards 0.4V, and the output signal Ssfn of the low level shifting circuit Ishn starts falling quickly from 1.1V towards 0V. As the output signal Ssfn quickly becomes lower than the shifting level Vnth set by the low buffer circuit BL, the signal Sn also falls from 1.1V to 0V at about the time point t0. At this point, the pull-down circuit 608L becomes turned off as open circuit.

At a time point t1, the voltage of the output signal Ssfp becomes lower than the shifting voltage Vpth set by the high buffer circuit BH, and the signal Sp changes from 1.5V to 0.4V. At this point, the pull-up circuit 608H is turned on and becomes conducted. The voltage Vpad is pulled up by the pull-up circuit 608H from 0V to 1.5V.

A period from the time point t0 to the time point t1 is a non-overlapping period Tdead-r, in which the pull-up circuit 608H and the pull-down circuit 608L are both turned off and not conducted. Meanwhile, since the pad 610 is not charged/discharged, the voltage Vpad stays in a status as before the time point t0, i.e., 0V.

At a time point t2, the core signal S-core changes from 1.1V to 0V. The output signal Ssfp of the high level shifting circuit Ishp starts rising quickly from 0.4V towards 1.5V, and the output signal Ssfn of the low level shifting circuit 608L starts rising moderately from 0V towards 1.1V. As the output signal Ssfp quickly becomes higher than the shifting voltage Vpth set by the high buffer circuit BH, the signal Sp changes from 0.4V to 1.5V also at about the time point t2. At this point, the pull-up circuit 608H becomes turned off as open circuit.

A period from the time point t1 to the time point t2 is defined as a high turn-on period, in which only the pull-up circuit 608H is turned on while the pull-down circuit 608L is turned off.

At a time point t3, the voltage of the output signal Ssfn becomes higher than the shifting level Vnth set by the low buffer circuit BL, and the signal Sn changes from 0V to 1.1V. At this point, the pull-down circuit 608L is turned on to start entering a pull-down turn-on period Tls-on, in which the pull-up circuit 608H is turned off and the pull-down circuit 608L is turned on. The voltage Vpad is pulled down from 1.5V to 0V by the pull-down circuit 608L.

A period from the time point t2 to the time point t3 is another non-overlapping period Tdead-f, in which both of the pull-up circuit 608H and the pull-down circuit 608L are turned off and not conducted. At this point, since the pad 610 is not charged/discharged, the voltage Vpad stays in a status as before the time point t2, i.e., 1.5V.

Lengths of the non-overlapping periods Tdead-f and Tdead-r are fundamentally determined by the shifting levels Vpth and Vnth defined by the pull-up buffer circuit BH and the pull-down buffer circuit BL. However, it is known from the above analysis that, regardless of values of the shifting levels Vpth and Vnth, given change rates of rising and falling voltages of the output signals Ssfp and Ssfn are appropriately distinguished, the non-overlapping periods Tdead-f and Tdead-r are assuredly present. This means that designs of the high buffer circuit BH and the low buffer circuit BL can be extremely simple and only need to consider lowering the capacitive load. In other words, although the low level shifting circuit Ishn is similar to a dummy level shifting circuit and does not provide a level shifting function as the high level shifting circuit Ishp, the low level shifting circuit Ishn and the high level shifting circuit Ishp may coexist to provide a non-overlapping function and to simplify the designs of the high buffer circuit BH and the low buffer circuit BL.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An output apparatus, comprising:
a high level shifting circuit, configured to shift an input signal to a high output signal, the input signal having two input logic levels, the high output signal is at one of two different high output logic levels;
a high buffer circuit, configured to drive a high control node according to the high output signal;
a low level shifting circuit, configured to shift the input signal to a low output signal, the low output signal is at one of two different low output logic levels;
a low buffer circuit, configured to drive a low control node according to the low output signal; and
an output driver, comprising the high control node and the low control node, configured to drive a pad;
wherein, the two low output logic levels are the same as the two input logic levels.

2. The output apparatus according to claim 1, wherein the two high output logic levels are respectively voltages of a high power line and a first power line, the two low output logic levels are respectively voltages of a low power line and a second power line, and the output driver is powered by the high power line and the low power line.

3. The output apparatus according to claim 1, wherein the high level shifting circuit and the low level shifting circuit provide a non-overlapping function.

4. The output apparatus according to claim 1, wherein a falling voltage change rate of the high output signal is smaller than a falling voltage change rate of the low output signal.

5. The output apparatus according to claim 1, wherein a rising voltage change rate of the high output signal is greater than a rising voltage change rate of the low output signal.

6. The output apparatus according to claim 1, wherein a bias providing circuit provides a reference bias to the high level shifting circuit to control a lower of the two high output logic levels.

7. The output apparatus according to claim 1, wherein a bias providing circuit provides a reference bias to the low level shifting circuit to control a higher of the two low output logic levels.

* * * * *